(12) United States Patent
Panigrahi et al.

(10) Patent No.: US 11,923,840 B1
(45) Date of Patent: Mar. 5, 2024

(54) POWER DOWN SIGNAL GENERATOR

(71) Applicant: NXP B.V., Eindhoven (NL)

(72) Inventors: Chinmayee Kumari Panigrahi, Bangalore (IN); Sunil Chandra Kasanyal, Arnhem (NL); Shashank Sunil Amati, Bellary (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 18/180,167

(22) Filed: Mar. 8, 2023

(30) Foreign Application Priority Data

Nov. 11, 2022 (IN) .............................. 202221064650

(51) Int. Cl.
*G06F 1/24* (2006.01)
*G06F 1/28* (2006.01)
*H03K 17/687* (2006.01)
*H03K 19/0185* (2006.01)

(52) U.S. Cl.
CPC ........... *H03K 17/6872* (2013.01); *G06F 1/28* (2013.01); *H03K 19/018571* (2013.01)

(58) Field of Classification Search
CPC ..... G06F 1/24; G06F 1/26; G06F 1/28; G06F 1/30; H03K 17/22; H03K 17/223; H03K 17/687; H03K 17/6871; H03K 17/6872; H03K 19/0175; H03K 19/0185; H03K 19/018557; H03K 19/018564; H03K 19/018571
See application file for complete search history.

(56) References Cited

U.S. PATENT DOCUMENTS

| 4,658,156 | A | 4/1987 | Hashimoto |
| 4,786,825 | A | 11/1988 | O'Shaughnessy et al. |
| 7,675,345 | B2 | 3/2010 | Fayed et al. |
| 8,106,688 | B2 | 1/2012 | Huang et al. |
| 10,514,742 | B2* | 12/2019 | Dhasmana ......... H03K 19/0016 |
| 11,296,680 | B2* | 4/2022 | Shu .......................... H03K 5/24 |

* cited by examiner

*Primary Examiner* — Long Nguyen

(57) ABSTRACT

A power down signal generator generates a power down signal. The power down signal generator includes a detection transistor, a resistor coupled in series with the detection transistor, and a compensation transistor coupled in parallel to the resistor. The detection transistor receives a first supply voltage in a first voltage domain and a current. A control voltage is generated across the resistor based on a first part of the current. The compensation transistor receives a bias voltage derived from a second supply voltage in a second voltage domain and sinks, based on the bias voltage, a second part of the current to maintain the control voltage within a predefined range. The generation of the power down signal is controlled based on the first supply voltage and the control voltage.

20 Claims, 3 Drawing Sheets

POWER DOWN SIGNAL GENERATOR

CROSS-REFERENCE TO RELATED APPLICATIONS

This application claims the priority under 35 U.S.C. § 119 of India application no. 202221064650, filed on 11 Nov. 2022, the contents of which are incorporated by reference herein.

FIELD OF USE

The present disclosure relates generally to electronic circuits, and, more particularly, to a power down signal generator.

BACKGROUND

An integrated circuit (IC) may include a core domain and an input/output (IO) domain, where a functional signal associated with the core domain is altered (e.g., level shifted) for utilization in the 10 domain. However, when the core domain is down (e.g., when a supply voltage of the core domain is less than a threshold level), the functional signal may be in an undefined state. Utilization of such a functional signal may result in the malfunction of various components of the 10 domain.

BRIEF DESCRIPTION OF THE DRAWINGS

The following detailed description of the embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1:
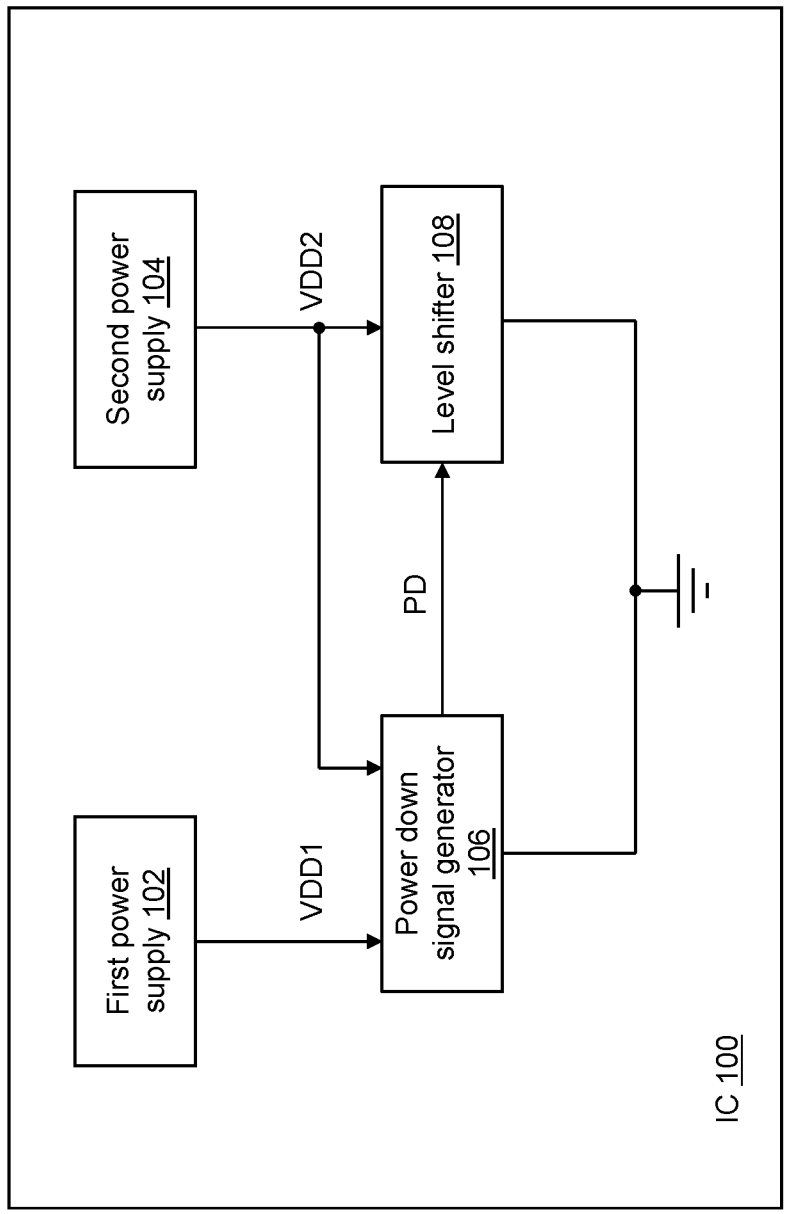
FIG. 1 illustrates a schematic block diagram of an integrated circuit (IC) in accordance with an embodiment of the present disclosure.

The detailed description of the appended drawings is intended as a description of the embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In an embodiment of the present disclosure, a circuit is disclosed. The circuit may include a power down signal generator that may be configured to generate a power down signal. The power down signal generator may include a detection transistor, a first resistor, and a compensation transistor. The detection transistor may be configured to receive a first supply voltage in a first voltage domain and a target current. The first resistor may be coupled in series with the detection transistor, and may have a control voltage generated thereacross based on a first part of the target current. The compensation transistor may be coupled in parallel to the first resistor. Further, the compensation transistor may be configured to receive a first bias voltage that is derived from a second supply voltage in a second voltage domain and sink, based on the first bias voltage, a second part of the target current to maintain the control voltage within a first predefined range. An operational state of the detection transistor is controlled based on the first supply voltage and the control voltage. Further, the generation of the power down signal is controlled based on the operational state of the detection transistor.

In another embodiment of the present disclosure, a circuit is disclosed. The circuit may include a power down signal generator that may be configured to generate a power down signal. The power down signal generator may include a detection transistor, a protection transistor, a first resistor, and a compensation transistor. The detection transistor may be configured to receive a first supply voltage in a first voltage domain. The protection transistor may be coupled in series with the detection transistor. The protection transistor may be configured to receive a target current and a first bias voltage that is derived from a second supply voltage in a second voltage domain. The first bias voltage is such that a drain voltage of the detection transistor is maintained within a tolerance limit thereof. The first resistor may be coupled in series with the detection transistor, and may have a control voltage generated thereacross based on a first part of the target current. Further, the compensation transistor may be coupled in parallel to the first resistor. The compensation transistor may be configured to receive a second bias voltage that is derived from the second supply voltage and sink, based on the second bias voltage, a second part of the target current to maintain the control voltage within a first predefined range. A variation in the second supply voltage results in a variation in the target current and the second bias voltage, and based on the variation in the target current and the second bias voltage, a magnitude of the second part of the target current sunk by the compensation transistor is controlled such that the control voltage is maintained within the first predefined range. Further, an operational state of the detection transistor is controlled based on the first supply voltage and the control voltage, and the generation of the power down signal is controlled based on the operational state of the detection transistor.

In yet another embodiment of the present disclosure, a circuit is disclosed. The circuit may include a power down signal generator that may be configured to generate a power down signal. The power down signal generator may include a detection transistor, a protection transistor, a compensation transistor, and a first resistor. The detection transistor may include a gate terminal configured to receive a first supply voltage in a first voltage domain, a drain terminal, and a source terminal. The protection transistor may include a drain terminal configured to receive a target current, a gate terminal configured to receive a first bias voltage derived from a second supply voltage in a second voltage domain, and a source terminal coupled to the drain terminal of the detection transistor. Further, the compensation transistor may include a drain terminal coupled to the source terminal of the detection transistor, a gate terminal configured to receive a second bias voltage derived from the second supply voltage, and a source terminal. The first resistor may be coupled in parallel between the source and drain terminals of the compensation transistor. The protection and detection transistors may be located in a current path and the generation of the power down signal is based on a voltage of a node in the current path.

In some embodiments, the protection transistor may be further configured to generate a first detection signal that is indicative of a power status of the first supply voltage. The protection transistor may generate the first detection signal at the drain terminal thereof. The power down signal may be derived from the first detection signal.

In some embodiments, the power down signal generator may further include an amplification circuit that may be coupled to the protection transistor. The amplification circuit may be configured to receive the first detection signal and generate the power down signal as an amplified version of the first detection signal.

In some embodiments, the power down signal generator may further include a current generator and first through third bias transistors. The current generator may be configured to generate a reference current based on the second supply voltage. The first bias transistor may include a source terminal configured to receive the second supply voltage, a gate terminal configured to receive a reference voltage that is generated based on the reference current, and a drain terminal. The second bias transistor may include a drain terminal coupled to the drain terminal of the first bias transistor and the gate terminal of the protection transistor, a gate terminal coupled to the drain terminal of the second bias transistor, and a source terminal. Further, the third bias transistor may include a drain terminal coupled to the source terminal of the second bias transistor and the gate terminal of the compensation transistor, a gate terminal coupled to the drain terminal of the third bias transistor, and a source terminal coupled to a ground terminal. Based on the reference voltage and a size of the first bias transistor, a first scaled version of the reference current passes through the second and third bias transistors. Based on the first scaled version of the reference current, the second and third bias transistors may be configured to generate the second and first bias voltages at the drain terminals thereof, respectively. Further, the first bias voltage is less than the second bias voltage.

In some embodiments, a gate dielectric thickness of the detection transistor is less than a gate dielectric thickness of the protection transistor.

In some embodiments, during a ramp-up of the first supply voltage, the target current may have a first value and during a ramp-down of the first supply voltage, the target current may have a second value that is different from the first value. A threshold voltage of the detection transistor for the first value of the target current may be greater than that for the second value of the target current.

In some embodiments, the power down signal generator may further include a current generator, a first scaling circuit, and a second scaling circuit. The current generator may be configured to generate a reference current based on the second supply voltage. The first and second scaling circuits may be coupled to the current generator, and configured to generate second and third scaled versions of the reference current, respectively. The first value of the target current corresponds to a sum of the second and third scaled versions of the reference current, whereas the second value of the target current corresponds to the second scaled version of the reference current.

In some embodiments, the power down signal generator may further include a switch that may be coupled to the second scaling circuit. Further, the detection transistor may be coupled to the first scaling circuit and the switch. Based on the operational state of the detection transistor corresponding to a deactivated state and an activated state, the switch is activated and deactivated, respectively. The activation of the switch results in the detection transistor receiving the target current having the first value, and the deactivation of the switch results in the detection transistor receiving the target current having the second value.

In some embodiments, the power down signal generator may further include a start-up circuit that may be coupled to the current generator. The start-up circuit may be configured to provide a start-up current to the current generator to start up the current generator.

In some embodiments, the current generator may include first through fourth reference transistors and a second resistor. The first reference transistor may include a source terminal coupled to a ground terminal, a gate terminal, and a drain terminal coupled to the gate terminal of the first reference transistor. The first reference transistor may be configured to receive, at the gate and drain terminals thereof, a start-up current that enables a start-up of the current generator. The second reference transistor may include a gate terminal coupled to the gate terminal of the first reference transistor, a drain terminal, and a source terminal. The second resistor may be coupled to the source terminals of the first and second reference transistors. Further, the third reference transistor may include a source terminal configured to receive the second supply voltage, a gate terminal, and a drain terminal coupled to the gate terminal of the third reference transistor and the drain terminal of the second reference transistor. The fourth reference transistor may include a source terminal configured to receive the second supply voltage, a gate terminal coupled to the gate terminal of the third reference transistor, and a drain terminal coupled to the drain terminal of the first reference transistor. The reference current may be generated based on gate-source voltages of the first and second reference transistors and a resistance of the second resistor.

In some embodiments, based on the first supply voltage being greater than or equal to a sum of a threshold voltage of the detection transistor and the control voltage, the detection transistor is activated and the power down signal is at a logic low state. Further, based on the first supply voltage being less than the sum of the threshold voltage of the detection transistor and the control voltage, the detection transistor is deactivated and the power down signal is at a logic high state.

In some embodiments, the circuit may further include a level shifter that may be coupled to the power down signal generator. The level shifter may be configured to receive the power down signal. Based on the logic low state of the power down signal, the level shifter may be further configured to execute a level-shift operation. Further, based on the logic high state of the power down signal, the level shifter may be configured to operate in a standby mode.

In some embodiments, a process-voltage-temperature (PVT) variation associated with the power down signal generator may result in a variation in the threshold voltage of the detection transistor and a variation in the control voltage. The variation in the threshold voltage of the detection transistor is inverse to the variation in the control voltage. Therefore, the sum of the threshold voltage of the detection transistor and the control voltage may be maintained within a second predefined range.

In some embodiments, the compensation transistor may include a source terminal coupled to a ground terminal, a gate terminal configured to receive the first bias voltage, and a drain terminal. The first resistor may be coupled between the source and drain terminals of the compensation transistor. The control voltage generated across the first resistor may be such that the compensation transistor operates in a linear region of operation.

Conventionally, a power down signal, generated by a power down signal generator, is utilized to indicate when a core domain is down. For example, when a supply voltage of the core domain falls below a threshold level, the power down signal transitions from a logic low state to a logic high state, and based on the logic high state of the power down signal, various components of an input/output (IO) domain may operate in a standby mode. However, variations in a supply voltage of the 10 domain and/or process-voltage-temperature (PVT) variations result in a significant variation in the threshold level at which the power down signal transitions. Such a variation in the threshold level may result in a significant leakage current in the power down signal generator and may lead to an inaccurate transition of the power down signal (e.g., the power down signal may remain at the logic low state even when the core domain is down or may transition to the logic high state even when the core domain is up). Various components of the 10 domain may continue to malfunction due to the utilization of such a power down signal, thereby degrading the reliability of an integrated circuit (IC) including the power down signal generator.

Various embodiments of the present disclosure disclose an IC including a power down signal generator that may generate a power down signal. The power down signal generator may include a protection transistor, a detection transistor, a resistor, and a compensation transistor. The detection transistor may receive a first supply voltage in a first voltage domain (e.g., a core domain) and a target current that controls a threshold voltage of the detection transistor. The protection transistor may be coupled in series with the detection transistor and ensures that a drain voltage of the detection transistor is within a tolerance limit thereof. Further, the resistor may be coupled in series with the detection transistor, and may have a control voltage generated thereacross based on a first part of the target current. The compensation transistor may be coupled in parallel to the resistor, and may receive a bias voltage that is derived from a second supply voltage in a second voltage domain (e.g., an input/output domain). Based on the bias voltage, the compensation transistor may sink a second part of the target current to maintain the control voltage within a first predefined range. Further, an operational state of the detection transistor is controlled based on the first supply voltage being greater than or equal to the sum of the threshold voltage of the detection transistor and the control voltage. The generation of the power down signal is controlled based on the operational state of the detection transistor.

A variation in the second supply voltage results in a variation in the target current and the bias voltage, and based on the variation in the target current and the bias voltage, a magnitude of the second part of the target current sunk by the compensation transistor is controlled such that the control voltage is maintained within the first predefined range. Additionally, the threshold voltage of the detection transistor varies based on a PVT variation associated with the power down signal generator. However, the PVT variation further results in a variation in the control voltage, with the variation in the threshold voltage of the detection transistor being inverse to the variation in the control voltage. As a result, the sum of the threshold voltage of the detection transistor and the control voltage is maintained within a second predefined range.

Thus, in some embodiments of the present disclosure, variations in the second supply voltage and the PVT variations do not result in significant variations in the activation of the detection transistor (e.g., the first supply voltage at which the detection transistor is activated). Therefore, the leakage current in the power down signal generator of some embodiments of the present disclosure is significantly less than that in some conventional power down signal generators. Further, the accuracy of the transition of the power down signal is significantly greater than that in some conventional power down signal generators. Consequently, the malfunction of various components of the second voltage domain is prevented. As a result, the reliability of the IC of some embodiments of the present disclosure is significantly greater than that of an IC including some conventional power down signal generators.

FIG. 1 illustrates a schematic block diagram of an integrated circuit (IC) 100 in accordance with an embodiment of the present disclosure. The IC 100 may include a first power supply 102, a second power supply 104, a power down signal generator 106, and a level shifter 108.

The first power supply 102 and the second power supply 104 may be associated with a first voltage domain and a second voltage domain, respectively. In an embodiment, the first voltage domain corresponds to a core domain and the second voltage domain corresponds to an input/output (IO) domain. The first power supply 102 may be configured to generate a first supply voltage VDD1 and the second power supply 104 may be configured to generate a second supply voltage VDD2. In an embodiment, the second supply voltage VDD2 is greater than the first supply voltage VDD1. For example, the first supply voltage VDD1 may range from 0.68 volts (V) to 0.95 V, and the second supply voltage VDD2 may range from 1 V to 3.6 V. However, the first and second supply voltages VDD1 and VDD2 may have other values in other embodiments.

The power down signal generator 106 may be coupled to the first and second power supplies 102 and 104 and a ground terminal. The power down signal generator 106 may be configured to receive the first and second supply voltages VDD1 and VDD2 from the first and second power supplies 102 and 104, respectively. Based on the first and second supply voltages VDD1 and VDD2, the power down signal generator 106 may be further configured to generate a power down signal PD. The power down signal PD may be indicative of a power status of the first supply voltage VDD1. For example, the power down signal PD is at a logic low state when the first voltage domain is up (e.g., when the first supply voltage VDD1 is greater than or equal to a threshold level). Further, when the first voltage domain is down (e.g., when the first supply voltage VDD1 is less than the same or different threshold level), the power down signal PD is at a logic high state.

The power down signal generator 106 may experience a process-voltage-temperature (PVT) variation. Additionally, the second supply voltage VDD2 may vary. In the present disclosure, a logic state of the power down signal PD is relatively unaffected by the PVT variation in the power down signal generator 106 and/or the variation in the second supply voltage VDD2. The power down signal generator 106 is explained in detail in conjunction with FIG. 2.

The level shifter 108 may be coupled to the second power supply 104, the power down signal generator 106, and the ground terminal. The level shifter 108 may include suitable circuitry that may be configured to perform one or more operations. For example, the level shifter 108 may be configured to receive the second supply voltage VDD2 and the power down signal PD from the second power supply 104 and the power down signal generator 106, respectively. Based on the logic low state of the power down signal PD, the level shifter 108 may be further configured to execute a level-shift operation (e.g., an output signal of the level shifter 108 is a level-shifted version of an input signal thereof). The level-shift operation may be executed based on the second supply voltage VDD2. Further, based on the logic high state of the power down signal PD, the level shifter 108 may be configured to operate in a standby mode (e.g., the output signal of the level shifter 108 may be in a standby state). Based on the standby state of the output signal, various components (not shown) of the second voltage domain may operate in the standby mode. Thus, the power down signal PD prevents the malfunctioning of various components of the second voltage domain.

The level shifter 108 is one exemplary functional circuit that may utilize the power down signal PD for its operation. The scope of the present disclosure is however not limited to it. In various other embodiments, the power down signal PD may be utilized by various other functional circuits of the IC 100, without deviating from the scope of the present disclosure.

Although FIG. 1 illustrates that all the circuits are implemented on the IC 100, the scope of the present disclosure is not limited to it. In various other embodiments, some circuits may be external to the IC 100. For example, in some embodiments, the first and second power supplies 102 and 104 may be external to the IC 100.

The scope of the present disclosure is not limited to a lower supply voltage of the first and second voltage domain being a ground voltage. In other embodiments, the lower supply voltage may correspond to a non-zero value (e.g., −1 V).

Figure 2:
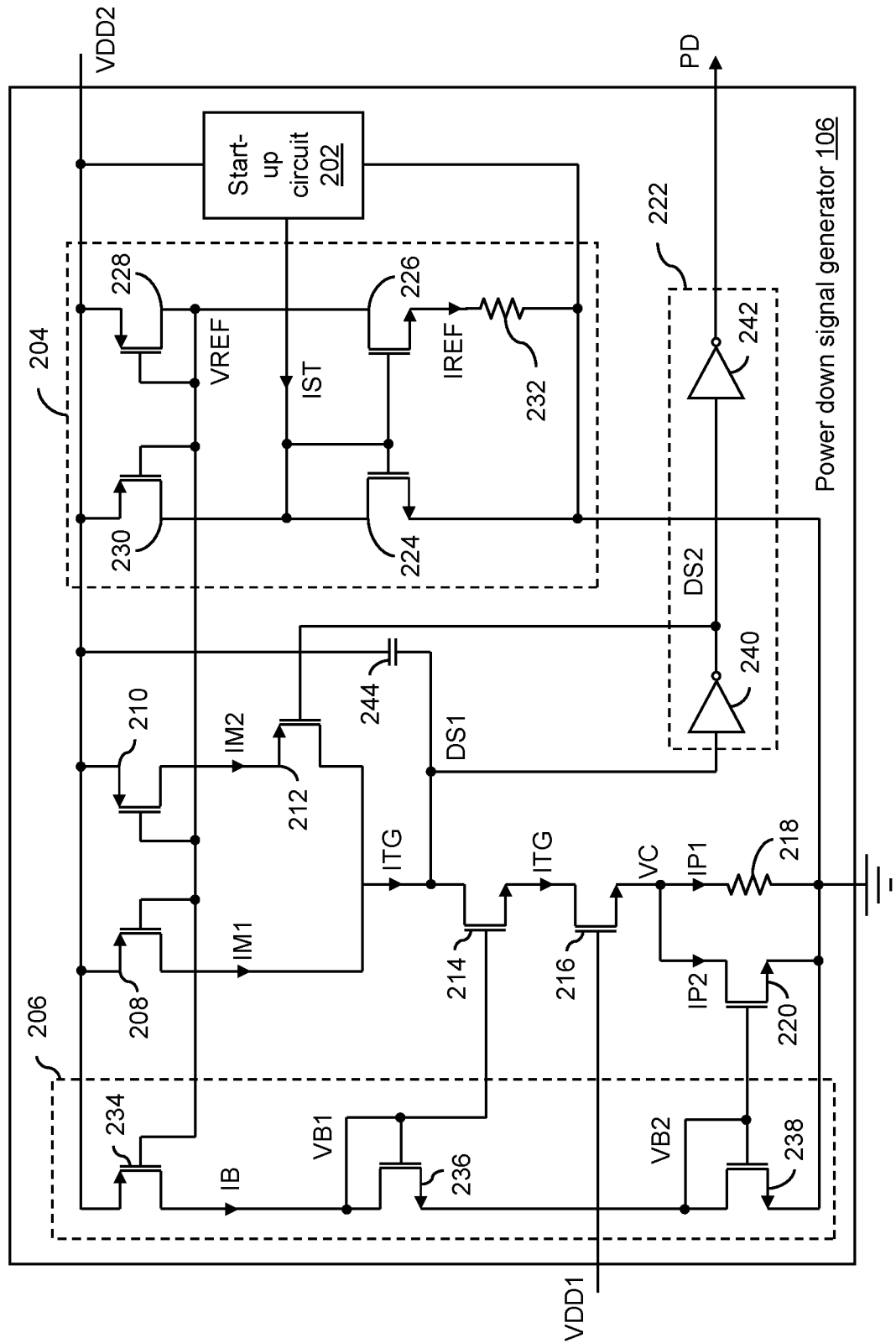
FIG. 2 illustrates a schematic circuit diagram of a power down signal generator of the IC of FIG. 1 in accordance with an embodiment of the present disclosure.

FIG. 2 illustrates a schematic circuit diagram of the power down signal generator 106 in accordance with an embodiment of the present disclosure. The power down signal generator 106 may include a start-up circuit 202, a current generator 204, a bias circuit 206, a first scaling circuit 208, a second scaling circuit 210, and a switch 212. The power down signal generator 106 may further include a protection transistor 214, a detection transistor 216, a first resistor 218, a compensation transistor 220, and an amplification circuit 222.

The start-up circuit 202 may be coupled to the current generator 204 and the second power supply 104. The start-up circuit 202 may be configured to receive the second supply voltage VDD2 from the second power supply 104 and generate a start-up current IST based on the second supply voltage VDD2. Further, the start-up circuit 202 may be configured to provide the start-up current IST to the current generator 204 to start up the current generator 204. The start-up circuit 202 is explained further in conjunction with FIG. 3.

The current generator 204 may be coupled to the start-up circuit 202 and the second power supply 104. The current generator 204 may be configured to receive the start-up current IST from the start-up circuit 202 and the second supply voltage VDD2 from the second power supply 104. Based on the start-up current IST, the current generator 204 may be started up. Further, post the start-up, the current generator 204 may be configured to generate a reference current IREF based on the second supply voltage VDD2. The reference current IREF is generated such that a variation in the second supply voltage VDD2 results in a minor variation in the reference current IREF. For example, if for the second supply voltage VDD2 of 1.1 V, the reference current IREF is 281.5 nanoamperes (nA), a change of the second supply voltage VDD2 to 3.6 V may result in the reference current IREF being equal to 365.9 nA. Thus, a 2.6 V variation in the second supply voltage VDD2 may result in a variation of 84.4 nA in the reference current IREF.

The current generator 204 may include first through fourth reference transistors 224-230 and a second resistor 232. In an embodiment, each of the first and second reference transistors 224 and 226 corresponds to an n-channel metal-oxide-semiconductor (NMOS) transistor and each of the third and fourth reference transistors 228 and 230 corresponds to a p-channel metal-oxide-semiconductor (PMOS) transistor. Each of the first through fourth reference transistors 224-230 may include source, gate, and drain terminals.

The source terminal of the first reference transistor 224 may be coupled to the ground terminal. Further, the gate terminal of the first reference transistor 224 may be coupled to the drain terminal of the first reference transistor 224. The first reference transistor 224 may be configured to receive, at the gate and drain terminals thereof, the start-up current IST that enables the start-up of the current generator 204. The gate terminal of the second reference transistor 226 may be coupled to the drain and gate terminals of the first reference transistor 224. The second resistor 232 may be coupled between the source terminals of the first and second reference transistors 224 and 226. The source terminals of the third and fourth reference transistors 228 and 230 may be coupled to the second power supply 104, and configured to receive the second supply voltage VDD2. Further, the drain terminals of the third and fourth reference transistors 228 and 230 may be coupled to the drain terminals of the second and first reference transistors 226 and 224, respectively. Additionally, the gate terminals of the third and fourth reference transistors 228 and 230 may be coupled to the drain terminal of the third reference transistor 228. In an embodiment, sizes of the third and fourth reference transistors 228 and 230 are the same. Further, a size of the second reference transistor 226 is a multiple of a size of the first reference transistor 224. The difference in sizes of the first and second reference transistors 224 and 226 results in gate-source voltages of the first and second reference transistors 224 and 226 being different.

Based on the coupling between the first through fourth reference transistors 224-230 and the second resistor 232, the reference current IREF is generated in the current generator 204. The reference current IREF may be generated across the second resistor 232. The reference current IREF may be generated based on the gate-source voltages of the first and second reference transistors 224 and 226 and a resistance of the second resistor 232. In an example, the reference current IREF is equal to a difference between the gate-source voltages of the first and second reference transistors 224 and 226 divided by the resistance of the second resistor 232. As the third and fourth reference transistors 228 and 230 are identical (e.g., have the same size), the reference current IREF may further flow in a branch including the first and fourth reference transistors 224 and 230. Further, a reference voltage VREF may be generated at the drain terminal of the third reference transistor 228. The reference voltage VREF may be generated based on the reference current IREF (e.g., may be indicative of the reference current IREF).

The scope of the present disclosure is not limited to the current generator 204 being implemented in an above-described manner. In various other embodiments, different or additional components may be utilized for implementing the current generator 204, without deviating from the scope of the present disclosure.

The bias circuit 206 may be coupled to the current generator 204 and the second power supply 104. The bias circuit 206 may be configured to receive the reference voltage VREF and the second supply voltage VDD2 from the current generator 204 and the second power supply 104, respectively. Based on the reference voltage VREF and the second supply voltage VDD2, the bias circuit 206 may be further configured to generate a first bias voltage VB1 and a second bias voltage VB2. The first and second bias voltages VB1 and VB2 are thus derived from the second supply voltage VDD2. In an embodiment, the second bias voltage VB2 may be less than the first bias voltage VB1.

The bias circuit 206 may include first through third bias transistors 234-238. In an embodiment, the first bias transistor 234 corresponds to a PMOS transistor, and the second and third bias transistors 236 and 238 correspond to NMOS transistors. Each of the first through third bias transistors 234-238 may include source, gate, and drain terminals.

The source terminal of the first bias transistor 234 may be coupled to the second power supply 104, and configured to receive the second supply voltage VDD2. Further, the gate terminal of the first bias transistor 234 may be coupled to the current generator 204 (e.g., the drain terminal of the third reference transistor 228), and configured to receive the reference voltage VREF. The drain terminal of the second bias transistor 236 may be coupled to the drain terminal of the first bias transistor 234, and the source terminal of the second bias transistor 236 may be coupled to the drain terminal of the third bias transistor 238. Further, the gate terminal of the second bias transistor 236 may be coupled to the drain terminal of the second bias transistor 236, and the gate terminal of the third bias transistor 238 may be coupled to the drain terminal of the third bias transistor 238. Additionally, the source terminal of the third bias transistor 238 may be coupled to the ground terminal. The second and third bias transistors 236 and 238 may thus correspond to diode-connected transistors.

The first bias transistor 234 may be configured to generate a bias current IB at the drain terminal thereof. The bias current IB may correspond to a first scaled version of the reference current IREF. For example, the bias current IB may be "k1" times the reference current IREF such that a value of "k1" may be equal to a ratio of a size of the third reference transistor 228 and a size of the first bias transistor 234. Thus, the bias current IB may be generated based on the reference voltage VREF, the second supply voltage VDD2, and the size of the first bias transistor 234. Further, the bias current IB may pass through the second and third bias transistors 236 and 238. Based on the bias current IB, the second and third bias transistors 236 and 238 may be configured to generate the first and second bias voltages VB1 and VB2 at the drain terminals thereof, respectively. In an example, the second bias voltage VB2 may correspond to a gate-source voltage of the third bias transistor 238 that is generated based on the bias current IB passing therethrough. Similarly, the first bias voltage VB1 may correspond to a sum of a gate-source voltage of the second bias transistor 236 and the second bias voltage VB2. Thus, the second bias voltage VB2 may be less than the first bias voltage VB1.

The first scaling circuit 208 may be coupled to the second power supply 104 and the current generator 204. The first scaling circuit 208 may be configured to receive the second supply voltage VDD2 from the second power supply 104 and the reference voltage VREF from the current generator 204. Based on the second supply voltage VDD2 and the reference voltage VREF, the first scaling circuit 208 may be further configured to generate a first intermediate current IM1 that is a second scaled version of the reference current IREF. In an embodiment, the first scaling circuit 208 corresponds to a PMOS transistor having a source terminal configured to receive the second supply voltage VDD2, a gate terminal configured to receive the reference voltage VREF, and a drain terminal at which the first intermediate current IM1 may be generated. The first intermediate current IM1 may be "k2" times the reference current IREF such that a value of "k2" may be equal to a ratio of the size of the third reference transistor 228 and a size of the first scaling circuit 208 (e.g., the PMOS transistor).

The second scaling circuit 210 may be coupled to the second power supply 104 and the current generator 204. The second scaling circuit 210 may be configured to receive the second supply voltage VDD2 from the second power supply 104 and the reference voltage VREF from the current generator 204. Based on the second supply voltage VDD2 and the reference voltage VREF, the second scaling circuit 210 may be further configured to generate a second intermediate current IM2 that is a third scaled version of the reference current IREF. In an embodiment, the second scaling circuit 210 may correspond to a PMOS transistor having a source terminal configured to receive the second supply voltage VDD2, a gate terminal configured to receive the reference voltage VREF, and a drain terminal at which the second intermediate current IM2 may be generated. The second intermediate current IM2 may be "k3" times the reference current IREF such that a value of "k3" may be equal to a ratio of the size of the third reference transistor 228 and a size of the second scaling circuit 210 (e.g., the PMOS transistor).

The scope of the present disclosure is not limited to the first and second scaling circuits 208 and 210 corresponding to single PMOS transistors. In other embodiments, the first and second scaling circuits 208 and 210 may be implemented using various other components (e.g., a serial coupling of PMOS transistors).

The protection transistor 214 may be coupled to the bias circuit 206, the first scaling circuit 208 (e.g., the drain terminal of the corresponding PMOS transistor), and the switch 212. The protection transistor 214 may be configured to receive the first bias voltage VB1 and a target current ITG. The target current ITG may have a first value or a second value. The first value of the target current ITG corresponds to a sum of the first and second intermediate currents IM1 and IM2, and the second value of the target current ITG corresponds to the first intermediate current IM1. Further, the protection transistor 214 may be configured to generate a first detection signal DS1. The first detection signal DS1 is indicative of the power status of the first supply voltage VDD1 such that the power down signal PD is derived from the first detection signal DS1. In an embodiment, the protection transistor 214 is an NMOS transistor including source, gate, and drain terminals.

The drain terminal of the protection transistor 214 may be coupled to the first scaling circuit 208 (e.g., the drain terminal of the corresponding PMOS transistor) and the switch 212, and configured to receive the target current ITG. The switch 212 may be coupled between the second scaling circuit 210 (e.g., the drain terminal of the corresponding PMOS transistor) and the drain terminal of the protection transistor 214. The switch 212 may be configured to receive a second detection signal DS2 that is an inverted version of the first detection signal DS1. In an embodiment, the switch 212 corresponds to a PMOS transistor having a source terminal coupled to the second scaling circuit 210, a gate terminal configured to receive the second detection signal DS2, and a drain terminal coupled to the drain terminal of the protection transistor 214. Thus, the switch 212 is activated (e.g., is closed) based on a logic high state of the first detection signal DS1 and deactivated (e.g., is open) based on a logic low state of the first detection signal DS1. Further, based on the activation of the switch 212, the protection transistor 214 may receive the target current ITG having the first value, and based on the deactivation of the switch 212, the protection transistor 214 may receive the target current ITG having the second value. The scope of the present disclosure is not limited to a PMOS transistor being utilized to implement the switch 212. In other embodiments, various other components may be utilized to perform the operations of the switch 212.

The gate terminal of the protection transistor 214 may be coupled to the drain and gate terminals of the second bias transistor 236, and configured to receive the first bias voltage VB1. The first bias voltage VB1 is such that the protection transistor 214 is activated, thereby resulting in a flow of the target current ITG across the protection transistor 214. Further, the protection transistor 214 may generate the first detection signal DS1 at the drain terminal thereof.

The detection transistor 216 may be coupled to the first power supply 102 and the protection transistor 214 (e.g., the source terminal of the protection transistor 214). The detection and protection transistors 216 and 214 are thus coupled in series. The detection transistor 216 may be configured to receive the first supply voltage VDD1 from the first power supply 102. Further, as the protection transistor 214 is activated, the detection transistor 216 may be configured to receive the target current ITG from the protection transistor 214. In other words, by way of the protection transistor 214, the detection transistor 216 may be coupled to the first scaling circuit 208 (e.g., the drain terminal of the corresponding PMOS transistor) and the switch 212, and configured to receive the target current ITG. The target current ITG may control a threshold voltage of the detection transistor 216 (hereinafter referred to as a "detection threshold voltage"). In an embodiment, the detection transistor 216 is an NMOS transistor including source, gate, and drain terminals.

The gate terminal of the detection transistor 216 may be coupled to the first power supply 102, and configured to receive the first supply voltage VDD1. The drain terminal of the detection transistor 216 may be coupled to the source terminal of the protection transistor 214, and configured to receive the target current ITG.

The detection transistor 216 is a first voltage domain device. In other words, voltages at all terminals of the detection transistor 216 are required to be within a tolerance limit of the detection transistor 216 (e.g., within a maximum value of the first supply voltage VDD1). Conversely, the protection transistor 214 (and every other transistor of the power down signal generator 106) is a second voltage domain device. In other words, voltages at all terminals of the protection transistor 214 are required to be within a tolerance limit of the protection transistor 214 (e.g., within a maximum value of the second supply voltage VDD2). In an embodiment, a gate dielectric thickness of the detection transistor 216 is less than a gate dielectric thickness of the protection transistor 214. In such a scenario, the first bias voltage VB1 received by the protection transistor 214 is such that a drain voltage at the drain terminal of the detection transistor 216 is within the tolerance limit of the detection transistor 216. The protection transistor 214 thus protects the detection transistor 216.

The first resistor 218 may be coupled between the detection transistor 216 (e.g., the source terminal of the detection transistor 216) and the ground terminal. Thus, the first resistor 218 may be coupled in series with the detection transistor 216. Further, a control voltage VC may be generated across the first resistor 218. The control voltage VC may be generated based on a first part of the target current ITG passing through the first resistor 218. The first part of the target current ITG is herein referred to as a "first part current IP1".

The compensation transistor 220 may be coupled in parallel to the first resistor 218, and further coupled to the bias circuit 206. In an embodiment, the compensation transistor 220 corresponds to an NMOS transistor including source, gate, and drain terminals. The source terminal of the compensation transistor 220 may be coupled to the first resistor 218 and the ground terminal. Further, the drain terminal of the compensation transistor 220 may be coupled to the first resistor 218 and the source terminal of the detection transistor 216. The first resistor 218 is thus coupled in parallel between the source and drain terminals of the compensation transistor 220. The control voltage VC generated across the first resistor 218 is such that the compensation transistor 220 operates in a linear region of operation.

The gate terminal of the compensation transistor 220 may be coupled to the bias circuit 206 (e.g., the drain terminal of the third bias transistor 238), and configured to receive the second bias voltage VB2. In an embodiment, a size of the compensation transistor 220 is twice that of the third bias transistor 238. The second bias voltage VB2 may control the drive strength of the compensation transistor 220. Thus, based on the second bias voltage VB2, the compensation transistor 220 may be further configured to sink a second part of the target current ITG to maintain the control voltage VC within a first predefined range. In an example, the first predefined range corresponds to 0.185 V to 0.21 V during a ramp-up of the first supply voltage VDD1 and 0.15 V to 0.165 V during a ramp-down of the first supply voltage VDD1. However, the first predefined range may have other values in other embodiments. The second part of the target current ITG is herein referred to as a "second part current IP2".

The operational state of the detection transistor 216 is thus controlled based on the first supply voltage VDD1, the detection threshold voltage, and the control voltage VC. In an embodiment, the detection transistor 216 is activated based on the first supply voltage VDD1 being greater than or equal to the sum of the detection threshold voltage and the control voltage VC, and deactivated based on the first supply voltage VDD1 being less than the sum of the detection threshold voltage and the control voltage VC. When the detection transistor 216 is activated, the first detection signal DS1 is pulled down to a logic low state. Conversely, when the detection transistor 216 is deactivated, the first detection signal DS1 is pulled up to a logic high state. The power down signal PD may be derived from the first detection signal DS1. Thus, the protection transistor 214 and the detection transistor 216 are located in a current path, and the generation of the power down signal PD is based on a voltage of a node (e.g., the node of the first detection signal DS1) in the current path.

The amplification circuit 222 may be coupled to the drain terminal of the protection transistor 214 and the level shifter 108. The amplification circuit 222 may be configured to receive the first detection signal DS1 and generate the power down signal PD as an amplified version of the first detection signal DS1. Further, the amplification circuit 222 may be configured to provide the power down signal PD to the level shifter 108. Additionally, the amplification circuit 222 may be coupled to the switch 212, and configured to generate and provide the second detection signal DS2 to the switch 212.

The amplification circuit 222 may include first and second inverters 240 and 242 that are coupled in series. The first inverter 240 may be coupled to the drain terminal of the protection transistor 214 and the switch 212. The first inverter 240 may be configured to receive the first detection signal DS1 from the drain terminal of the protection transistor 214, generate the second detection signal DS2 as the inverted version of the first detection signal DS1, and provide the second detection signal DS2 to the switch 212. The second inverter 242 may be coupled to the first inverter 240 and the level shifter 108. The second inverter 242 may be configured to receive the second detection signal DS2 from the first inverter 240, generate the power down signal PD as an inverted version of the second detection signal DS2, and provide the power down signal PD to the level shifter 108. Although not shown, the first and second inverters 240 and 242 receive the second supply voltage VDD2 at supply terminals thereof for performing the corresponding inversion operations.

When the first detection signal DS1 is at a logic high state, a voltage value of the first detection signal DS1 may be less than the second supply voltage VDD2 due to a few voltage drops along the propagation path. In such a scenario, the series-coupled first and second inverters 240 and 242, by way of the second supply voltage VDD2 received at the supply terminals thereof, may facilitate the generation of the power down signal PD equal to the second supply voltage VDD2 at a logic high state. Thus, the power down signal PD is the amplified version of the first detection signal DS1.

Although it is described that the amplification circuit 222 includes two series-coupled inverters, the scope of the present disclosure is not limited to it. In various other embodiments, additional or different components may be utilized for amplifying the first detection signal DS1 to generate the power down signal PD.

The power down signal generator 106 may further include a capacitor 244. The capacitor 244 may be coupled between the drain terminal of the protection transistor 214 and the second power supply 104. The capacitor 244 may be charged to a value equivalent to the second supply voltage VDD2. During a start-up of the IC 100 (e.g., the power down signal generator 106), when the first power supply 102 is not started up, the charged capacitor 244 may be utilized to maintain the first detection signal DS1, and in turn, the power down signal PD, at a logic high state.

In operation, during the ramp-up of the first supply voltage VDD1, the detection transistor 216 is deactivated and the first detection signal DS1 is at a logic high state. Thus, based on the operational state of the detection transistor 216 corresponding to a deactivated state, the switch 212 is activated. The activation of the switch 212 results in the protection transistor 214, and in turn the detection transistor 216, receiving the first value of the target current ITG (e.g., the sum of the first and second intermediate currents IM1 and IM2). Therefore, the detection threshold voltage is equal to a voltage required for the detection transistor 216 to drive a current equivalent to the first value of the target current ITG.

When the first supply voltage VDD1 is greater than or equal to the sum of the detection threshold voltage and the control voltage VC, the detection transistor 216 is activated (e.g., the operational state of the detection transistor 216 corresponds to an activated state). The operational state of the detection transistor 216 is thus controlled based on the first supply voltage VDD1, the detection threshold voltage, and the control voltage VC. Further, when the detection transistor 216 is activated, the first detection signal DS1 is drained to the ground terminal. In other words, the first detection signal DS1 is at a logic low state. Consequently, the power down signal PD is at a logic low state. Thus, the generation of the power down signal PD is controlled based on the operational state of the detection transistor 216. The power down signal PD thus indicates that the first voltage domain is up. In such a scenario, the level shifter 108 may execute the level-shift operation.

Based on the operational state of the detection transistor 216 corresponding to the activated state, the switch 212 is deactivated. The deactivation of the switch 212 results in the protection transistor 214, and in turn the detection transistor 216, receiving the second value of the target current ITG (e.g., the first intermediate current IM1). The second value of the target current ITG is less than the first value of the target current ITG. The reduced target current ITG once the first voltage domain is up results in reducing a leakage current in the power down signal generator 106. Further, the detection threshold voltage for the first value of the target current ITG is greater than the detection threshold voltage for the second value of the target current ITG. Additionally, the control voltage VC for the first value of the target current ITG is greater than the control voltage VC for the second value of the target current ITG. Thus, for the detection transistor 216 to be deactivated, the first supply voltage VDD1 is required to fall to a value that is less than the value at which the detection transistor 216 is activated. In other words, the voltage level at which the detection transistor 216 is activated (e.g., during the ramp-up of the first supply voltage VDD1) is different from the voltage level at which the detection transistor 216 is deactivated (e.g., during the ramp-down of the first supply voltage VDD1). Such different switching levels enable hysteresis in the power down signal generator 106. Thus, after the detection transistor 216 is activated, the detection threshold voltage is adjusted (e.g., lowered) to provide hysteresis in the power down signal generator 106 (e.g., to avoid false switching due to noise in the first supply voltage VDD1).

During the ramp-down of the first supply voltage VDD1, when the first supply voltage VDD1 is less than the sum of the detection threshold voltage and the control voltage VC, the detection transistor 216 is deactivated. Based on the deactivation of the detection transistor 216, the first detection signal DS1 is at a logic high state. Consequently, the switch 212 is activated and the target current ITG has the first value. Further, the transition of the first detection signal DS1 from a logic low state to a logic high state results in the power down signal PD transitioning from a logic low state to a logic high state. The logic high state of the power down signal PD indicates that the first voltage domain is down, and as a result, the level shifter 108 may operate in the standby mode. The power down signal generator 106 thus indicates the level shifter 108, and in turn, various components of the second voltage domain, of the first voltage domain going down, thereby preventing malfunctioning of various components of the second voltage domain.

As the detection transistor 216 is the first voltage domain device, the detection threshold voltage is significantly less than if the detection transistor 216 was the second voltage domain device. This ensures that during the ramp-up of the first supply voltage VDD1, the detection transistor 216 is activated for a lesser value of the first supply voltage VDD1 as opposed to if the detection transistor 216 were the second voltage domain device. In an example, if the detection transistor 216 was the second voltage domain device, the detection transistor 216 may be activated for the first supply voltage VDD1 of 1.1V, whereas in the present disclosure, the detection transistor 216 may be activated for the first supply voltage VDD1 of 0.68 V. The aforementioned values are exemplary and may be different in other embodiments. Further, the activation voltage (e.g., the sum of the detection threshold voltage and the control voltage VC) is maintained within a second predefined range even when there is a significant variation in the second supply voltage VDD2 (e.g., 1.1 V to 3.6 V). In an example, the second predefined range corresponds to 0.6 V to 0.68 V during the ramp-up of the first supply voltage VDD1 and 0.35 V to 0.36 V during the ramp-down of the first supply voltage VDD1. However, the second predefined range may have other values in other embodiments. As a result, the power down signal generator 106 may be implemented in low core supply voltage applications (e.g., up to 0.68 V). Examples of such applications may include wearable and hearable products, health care devices, mobile devices, or the like.

As the detection transistor 216 is the first voltage domain device, the direct coupling of the detection transistor 216 to the first scaling circuit 208 and the switch 212 may damage the detection transistor 216 due to the voltage at the drain terminal of the detection transistor 216 being greater than the tolerance limit thereof. Hence, in the present disclosure, the detection transistor 216 is coupled to the first scaling circuit 208 and the switch 212 by way of the protection transistor 214. The protection transistor 214 ensures that the drain voltage of the detection transistor 216 is less than the tolerance limit thereof. In other words, the protection transistor 214 protects the detection transistor 216.

During the ramp-down of the first supply voltage VDD1, the detection transistor 216 is deactivated for a higher value of the first supply voltage VDD1 as opposed to if the first resistor 218 was absent. For example, if the first resistor 218 was absent, the detection transistor 216 may be deactivated for the first supply voltage VDD1 of 0.19 V. Such a low voltage level may lead to the malfunction of various components of the second voltage domain. In the present disclosure, the presence of the first resistor 218 (e.g., the control voltage VC) ensures that the detection transistor 216 is deactivated for the first supply voltage VDD1 of 0.35 V, which is greater than a voltage level at which various components of the second voltage domain start to malfunction. The aforementioned values are exemplary and may be different in other embodiments. The presence of the first resistor 218 thus prevents the malfunctioning of various components of the second voltage domain.

In the present disclosure, the target current ITG is divided into two parts, with the first part current IP1 passing through the first resistor 218 and the second part current IP2 being sunk by the compensation transistor 220. Further, the target current ITG is derived from the reference current IREF, which is generated based on the second supply voltage VDD2. The second supply voltage VDD2 may vary significantly (e.g., from 1 V to 3.6 V). The variation in the second supply voltage VDD2 may result in the variation in the reference current IREF. The variation in the reference current IREF may lead to the variation in the target current ITG (e.g., by way of the first and second intermediate currents IM1 and IM2) and the second bias voltage VB2 (e.g., by way of the bias current IB). Based on the variation in the target current ITG and the second bias voltage VB2, a magnitude of the second part current IP2 sunk by the compensation transistor 220 is controlled such that the control voltage VC is maintained within the first predefined range. In other words, the variation in the second supply voltage VDD2 may result in a variation in the target current ITG. However, as the second bias voltage VB2 also varies and the compensation transistor 220 is operating in the linear region, the magnitude of the second part current IP2 varies such that an approximately equivalent current is sunk by the compensation transistor 220. As a result, the control voltage VC is maintained within the first predefined range, and the sum of the detection threshold voltage and the control voltage VC is maintained within the second predefined range. The difference between the minimum and maximum values of each of the first and second predefined ranges may be significantly less in comparison to the first and second supply voltages VDD1 and VDD2. Thus, the activation and deactivation of the detection transistor 216 may largely remain unaffected by the variation in the second supply voltage VDD2.

Additionally, the power down signal generator 106 may experience various PVT variations associated therewith. A PVT variation associated with the power down signal generator 106 results in a variation in the detection threshold voltage. However, the PVT variation may further result in a variation in the control voltage VC, with the variation in the detection threshold voltage being inverse to the variation in the control voltage VC. Thus, the sum of the detection threshold voltage and the control voltage VC is maintained within the second predefined range. The first resistor 218 thus corresponds to a feedback resistor that is coupled in a negative feedback configuration with the detection transistor 216. Hence, the activation and deactivation of the detection transistor 216 may largely remain unaffected by the PVT variations in the power down signal generator 106.

The first resistor 218 and the compensation transistor 220 are thus utilized in the power down signal generator 106 to improve the accuracy of the power down signal generator 106 (e.g., the accuracy of the activation and deactivation of the detection transistor 216).

Figure 3:
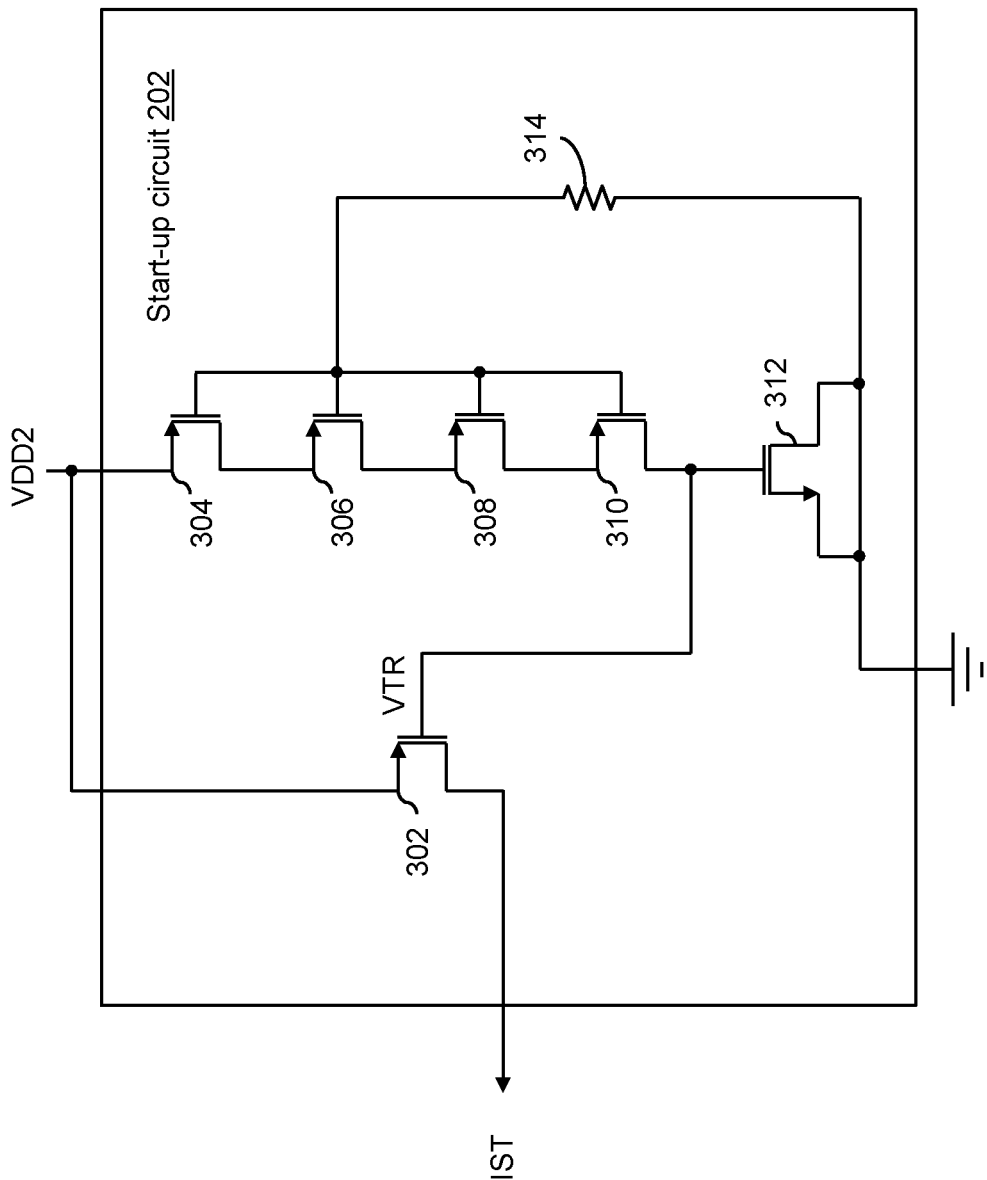
FIG. 3 illustrates a schematic circuit diagram of a start-up circuit of the power down signal generator of FIG. 2 in accordance with an embodiment of the present disclosure.

FIG. 3 illustrates a schematic circuit diagram of the start-up circuit 202 in accordance with an embodiment of the present disclosure. The start-up circuit 202 may include a start-up transistor 302, first through fourth trigger transistors 304-310, a safety control transistor 312, and a third resistor 314. In an embodiment, each of the start-up transistor 302 and first through fourth trigger transistors 304-310 correspond to a PMOS transistor and the safety control transistor 312 corresponds to an NMOS transistor. Each of the start-up transistor 302, the first through fourth trigger transistors 304-310, and the safety control transistor 312 may include source, gate, and drain terminals.

The source terminal of the start-up transistor 302 may be coupled to the second power supply 104, and configured to receive the second supply voltage VDD2. The gate terminal of the start-up transistor 302 may be configured to receive a trigger voltage VTR that controls the operation of the start-up transistor 302. Further, the drain terminal of the start-up transistor 302 may be coupled to the current generator 204 (e.g., the gate and drain terminals of the first reference transistor 224). Based on the second supply voltage VDD2 and the trigger voltage VTR, the start-up current IST may be generated at the drain terminal of the start-up transistor 302. Further, the drain terminal of the start-up transistor 302 may be configured to provide the start-up current IST to the current generator 204 to start up the current generator 204. During a start-up of the IC 100 (e.g., the power down signal generator 106), the trigger voltage VTR may be such that the start-up transistor 302 is activated and the start-up current IST is provided to the current generator 204 to start up the current generator 204. Based on the start-up of the current generator 204, the trigger voltage VTR may be such that the start-up transistor 302 is deactivated, thereby deactivating the start-up circuit 202.

The first through fourth trigger transistors 304-310 are coupled in series. Thus, the first through fourth trigger transistors 304-310 are collectively referred to as a "set of series-coupled transistors 304-310". The set of series-coupled transistors 304-310 may be coupled to the gate terminal of the start-up transistor 302, and configured to generate and provide the trigger voltage VTR to the gate terminal of the start-up transistor 302.

The gate terminals of the first through fourth trigger transistors 304-310 may be coupled to the ground terminal by way of the third resistor 314. The source terminal of the first trigger transistor 304 may be coupled to the second power supply 104, and configured to receive the second supply voltage VDD2. The drain terminal of the first trigger transistor 304 may be coupled to the source terminal of the second trigger transistor 306. Similarly, the drain terminal of the second trigger transistor 306 may be coupled to the source terminal of the third trigger transistor 308. Further, the drain terminal of the third trigger transistor 308 may be coupled to the source terminal of the fourth trigger transistor 310. The drain terminal of the fourth trigger transistor 310 may be coupled to the gate terminal of the start-up transistor 302. Further, the gate terminal of the safety control transistor 312 may be coupled to the gate terminal of the start-up transistor 302 and the drain terminal of the fourth trigger transistor 310. The source and drain terminals of the safety control transistor 312 may be coupled to the ground terminal so that the safety control transistor 312 exhibits a capacitive property.

During the start-up of the IC 100 (e.g., when the second voltage domain is activated), the gate terminal of the start-up transistor 302 may be coupled to the ground terminal by way of the safety control transistor 312. The start-up transistor 302 is thus activated and the start-up current IST is provided to the current generator 204 to start up the current generator 204. After a pre-determined time duration (e.g., after the current generator 204 is started-up), the set of series-coupled transistors 304-310 is activated. The third resistor 314 is included in the start-up circuit 202 to delay the activation of the set of series-coupled transistors 304-310. Once the set of series-coupled transistors 304-310 is activated, the trigger voltage VTR may be pulled up to the second supply voltage VDD2, thereby deactivating the start-up transistor 302, and in turn, the start-up circuit 202.

The scope of the present disclosure is not limited to the start-up circuit 202 being implemented in an above-described manner. In other embodiments, additional or different components may be utilized for implementing the start-up circuit 202, without deviating from the scope of the present disclosure.

Thus, in some embodiments of the present disclosure, variations in the second supply voltage VDD2 and the PVT variations do not result in significant variations in the activation of the detection transistor 216. Therefore, the leakage current in the power down signal generator 106 is significantly less than that in some conventional power down signal generators. Further, the accuracy of the transition of the power down signal PD is significantly greater than that in some conventional power down signal generators. Consequently, the malfunction of various components of the second voltage domain is prevented. As a result, the reliability of the IC 100 is significantly greater than that of an IC including some conventional power down signal generators.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A circuit, comprising:
a power down signal generator configured to generate a power down signal, the power down signal generator comprising:
   a detection transistor configured to receive (i) a first supply voltage in a first voltage domain and (ii) a target current;
   a first resistor coupled in series with the detection transistor, wherein the first resistor has a control voltage generated thereacross based on a first part of the target current; and
   a compensation transistor that is coupled in parallel to the first resistor, and configured to (i) receive a first bias voltage that is derived from a second supply voltage in a second voltage domain and (ii) sink, based on the first bias voltage, a second part of the target current to maintain the control voltage within a first predefined range,
      wherein an operational state of the detection transistor is controlled based on the first supply voltage and the control voltage, and
      wherein the generation of the power down signal is controlled based on the operational state of the detection transistor.

2. The circuit of claim 1, wherein a variation in the second supply voltage results in a variation in the target current and the first bias voltage, and wherein based on the variation in the target current and the first bias voltage, a magnitude of the second part of the target current sunk by the compensation transistor is controlled such that the control voltage is maintained within the first predefined range.

3. The circuit of claim 1, wherein the power down signal generator further comprises a protection transistor that is coupled in series with the detection transistor, and configured to receive the target current and a second bias voltage that is derived from the second supply voltage, and wherein the second bias voltage is such that the protection transistor is activated and a drain voltage of the detection transistor is maintained within a tolerance limit thereof.

4. The circuit of claim 3, wherein the protection transistor is further configured to generate a first detection signal that is indicative of a power status of the first supply voltage, and wherein the power down signal is derived from the first detection signal.

5. The circuit of claim 4, wherein the power down signal generator further comprises an amplification circuit that is coupled to the protection transistor, and configured to receive the first detection signal and generate the power down signal as an amplified version of the first detection signal.

6. The circuit of claim 3,
wherein the compensation transistor comprises (i) a source terminal coupled to a ground terminal, (ii) a gate terminal configured to receive the first bias voltage, and (iii) a drain terminal,
wherein the first resistor is coupled between the source terminal and the drain terminal of the compensation transistor,
wherein the detection transistor comprises (i) a source terminal coupled to the first resistor and the drain terminal of the compensation transistor, (ii) a gate terminal configured to receive the first supply voltage, and (iii) a drain terminal, and
wherein the protection transistor comprises (i) a source terminal coupled to the drain terminal of the detection transistor, (ii) a gate terminal configured to receive the second bias voltage, and (iii) a drain terminal configured to receive the target current.

7. The circuit of claim 6, wherein the power down signal generator further comprises:
a current generator configured to generate a reference current based on the second supply voltage;
a first bias transistor that comprises (i) a source terminal configured to receive the second supply voltage, (ii) a gate terminal configured to receive a reference voltage that is generated based on the reference current, and (iii) a drain terminal;
a second bias transistor that comprises (i) a drain terminal coupled to the drain terminal of the first bias transistor and the gate terminal of the protection transistor, (ii) a gate terminal coupled to the drain terminal of the second bias transistor, and (iii) a source terminal; and
a third bias transistor that comprises (i) a drain terminal coupled to the source terminal of the second bias transistor and the gate terminal of the compensation transistor, (ii) a gate terminal coupled to the drain terminal of the third bias transistor, and (iii) a source terminal coupled to the ground terminal,
wherein based on the reference voltage and a size of the first bias transistor, a first scaled version of the reference current passes through the second bias transistor and the third bias transistor,
wherein based on the first scaled version of the reference current, the second bias transistor is configured to generate the second bias voltage at the drain terminal thereof and the third bias transistor is configured to generate the first bias voltage at the drain terminal thereof, and
wherein the first bias voltage is less than the second bias voltage.

8. The circuit of claim 3, wherein a gate dielectric thickness of the detection transistor is less than a gate dielectric thickness of the protection transistor.

9. The circuit of claim 1, wherein during a ramp-up of the first supply voltage, the target current has a first value and during a ramp-down of the first supply voltage, the target current has a second value that is different from the first value, and wherein a threshold voltage of the detection transistor for the first value of the target current is greater than the threshold voltage of the detection transistor for the second value of the target current.

10. The circuit of claim 9, wherein the power down signal generator further comprises:
a current generator configured to generate a reference current based on the second supply voltage;
a first scaling circuit that is coupled to the current generator and the detection transistor, and configured to generate a second scaled version of the reference current; and
a second scaling circuit that is coupled to the current generator, and configured to generate a third scaled version of the reference current, wherein the first value of the target current corresponds to a sum of the second scaled version of the reference current and the third scaled version of the reference current, and wherein the second value of the target current corresponds to the second scaled version of the reference current.

11. The circuit of claim 10, wherein the power down signal generator further comprises a switch that is coupled to the second scaling circuit and the detection transistor, wherein based on the operational state of the detection transistor corresponding to a deactivated state, the switch is activated, and based on the operational state of the detection transistor corresponding to an activated state, the switch is deactivated, and wherein the activation of the switch results in the detection transistor receiving the target current having the first value, and the deactivation of the switch results in the detection transistor receiving the target current having the second value.

12. The circuit of claim 10, wherein the power down signal generator further comprises a start-up circuit that is coupled to the current generator, and configured to provide a start-up current to the current generator to start up the current generator.

13. The circuit of claim 10, wherein the current generator comprises:
a first reference transistor that comprises (i) a source terminal coupled to a ground terminal, (ii) a gate terminal, and (iii) a drain terminal coupled to the gate terminal of the first reference transistor, wherein the first reference transistor is configured to receive, at the gate terminal and the drain terminal thereof, a start-up current that enables a start-up of the current generator;
a second reference transistor that comprises (i) a gate terminal coupled to the gate terminal of the first reference transistor, (ii) a drain terminal, and (iii) a source terminal;
a second resistor coupled to the source terminal of the first reference transistor and the source terminal of the second reference transistor;
a third reference transistor that comprises (i) a source terminal configured to receive the second supply voltage, (ii) a gate terminal, and (iii) a drain terminal coupled to the gate terminal of the third reference transistor and the drain terminal of the second reference transistor; and
a fourth reference transistor that comprises (i) a source terminal configured to receive the second supply voltage, (ii) a gate terminal coupled to the gate terminal of the third reference transistor, and (iii) a drain terminal coupled to the drain terminal of the first reference transistor, wherein the reference current is generated based on a gate-source voltage of the first reference transistor, a gate-source voltage of the second reference transistor, and a resistance of the second resistor.

14. The circuit of claim 1, wherein based on the first supply voltage being greater than or equal to a sum of a threshold voltage of the detection transistor and the control voltage, the detection transistor is activated and the power down signal is at a logic low state, and wherein based on the first supply voltage being less than the sum of the threshold voltage of the detection transistor and the control voltage, the detection transistor is deactivated and the power down signal is at a logic high state.

15. The circuit of claim 14, further comprising a level shifter that is coupled to the power down signal generator, and configured to receive the power down signal, wherein based on the logic low state of the power down signal, the level shifter is further configured to execute a level-shift operation, and wherein based on the logic high state of the power down signal, the level shifter is further configured to operate in a standby mode.

16. The circuit of claim 14, wherein a process-voltage-temperature (PVT) variation associated with the power down signal generator results in a variation in the threshold voltage of the detection transistor and a variation in the control voltage, and wherein the variation in the threshold voltage of the detection transistor is inverse to the variation in the control voltage, thereby maintaining the sum of the threshold voltage of the detection transistor and the control voltage within a second predefined range.

17. The circuit of claim 1, wherein the compensation transistor comprises (i) a source terminal coupled to a ground terminal, (ii) a gate terminal configured to receive the first bias voltage, and (iii) a drain terminal, wherein the first resistor is coupled between the source terminal and the drain terminal of the compensation transistor, and wherein the control voltage generated across the first resistor is such that the compensation transistor operates in a linear region of operation.

18. A circuit, comprising:
  a power down signal generator configured to generate a power down signal, the power down signal generator comprising:
    a detection transistor configured to receive a first supply voltage in a first voltage domain;
    a protection transistor that is coupled in series with the detection transistor, and configured to receive (i) a target current and (ii) a first bias voltage that is derived from a second supply voltage in a second voltage domain, wherein the first bias voltage is such that a drain voltage of the detection transistor is maintained within a tolerance limit thereof;
    a first resistor coupled in series with the detection transistor, wherein the first resistor has a control voltage generated thereacross based on a first part of the target current; and
    a compensation transistor that is coupled in parallel to the first resistor, and configured to (i) receive a second bias voltage that is derived from the second supply voltage and (ii) sink, based on the second bias voltage, a second part of the target current to maintain the control voltage within a first predefined range,
    wherein a variation in the second supply voltage results in a variation in the target current and the second bias voltage, and based on the variation in the target current and the second bias voltage, a magnitude of the second part of the target current sunk by the compensation transistor is controlled such that the control voltage is maintained within the first predefined range,
    wherein an operational state of the detection transistor is controlled based on the first supply voltage and the control voltage, and
    wherein the generation of the power down signal is controlled based on the operational state of the detection transistor.

19. The circuit of claim 18, wherein based on the first supply voltage being greater than or equal to a sum of a threshold voltage of the detection transistor and the control voltage, the detection transistor is activated and the power down signal is at a logic low state, and wherein based on the first supply voltage being less than the sum of the threshold voltage of the detection transistor and the control voltage, the detection transistor is deactivated and the power down signal is at a logic high state.

20. A circuit, comprising:
  a power down signal generator configured to generate a power down signal, the power down signal generator comprising:
    a detection transistor that comprises (i) a gate terminal configured to receive a first supply voltage in a first voltage domain, (ii) a drain terminal, and (iii) a source terminal;
    a protection transistor that comprises (i) a drain terminal configured to receive a target current, (ii) a gate terminal configured to receive a first bias voltage that is derived from a second supply voltage in a second voltage domain, and (iii) a source terminal coupled to the drain terminal of the detection transistor;
    a compensation transistor that comprises (i) a drain terminal coupled to the source terminal of the detection transistor, (ii) a gate terminal configured to receive a second bias voltage that is derived from the second supply voltage, and (iii) a source terminal; and
    a first resistor that is coupled in parallel between the source terminal and the drain terminal of the compensation transistor,
    wherein the protection transistor and the detection transistor are located in a current path, and
    wherein the generation of the power down signal is based on a voltage of a node in the current path.

* * * * *